July 2, 1929. W. G. CADY Re. 17,359

PIEZO ELECTRIC RESONATOR

Original Filed Jan. 28, 1920

INVENTOR
WALTER G. CADY by David Rines
ATTORNEY

Reissued July 2, 1929.

Re. 17,359

UNITED STATES PATENT OFFICE.

WALTER G. CADY, OF MIDDLETOWN, CONNECTICUT, ASSIGNOR TO RADIO CORPORATION OF AMERICA, A CORPORATION OF DELAWARE.

PIEZO-ELECTRIC RESONATOR.

Original No. 1,450,246, dated April 3, 1923, Serial No. 354,659, filed January 28, 1920. Application for reissue filed August 6, 1925. Serial No. 48,681.

DIVISION E.

The present invention relates to electrical systems, and more particularly to systems comprising electro-mechanical vibrators.

A chief object of the invention is to provide an improved method of, and system and apparatus for, transmitting energy from one electric circuit to another. Other objects will appear hereinafter, and will be particularly pointed out in the appended claims.

Figure 1:
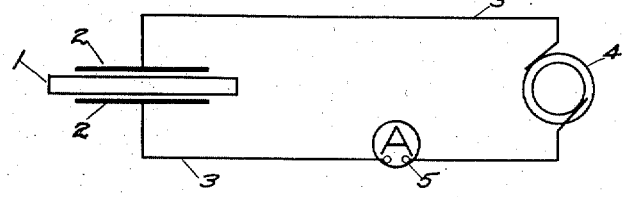
Figure 2:
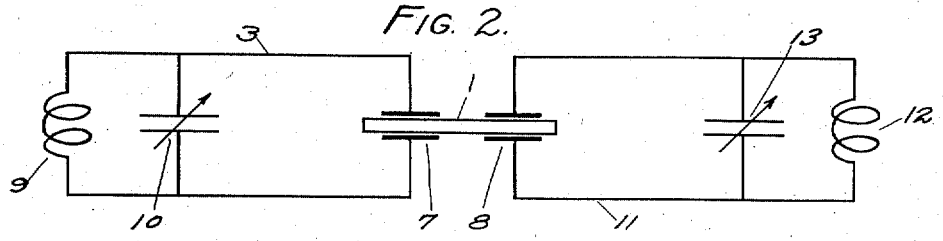

In the accompanying drawings, Fig. 1 is a diagrammatic view of a circuit and apparatus illustrating the principles underlying the present invention; and Fig. 2 is a similar view, illustrating a preferred form of the invention.

For many years it has been known that quartz, tourmaline and certain other crystals, if compressed or otherwise strained in certain directions, respond electrically, so as to exhibit positive and negative electrification in certain regions on their surfaces. It has also been known that the converse effect obtains, that is to say, that such crystals, when electrically stimulated, as by being placed in an electric field, become deformed. This phenomenon has been known as piezo-electricity. In the specification and the claims, the action of the electric forces to cause mechanical deformation will, for brevity, be called "stimulation"; and the development of the electromotive force by the deformation will be called "response". A large number of both natural and artificial crystals have been found to possess this piezo-electric property. The general knowledge on the subject has so far developed that it is now possible to predict in advance whether a given crystal will show the piezo-electric effect, and in what manner a plate or rod should be cut from the crystal in order to exhibit this effect to the greatest possible degree.

The crystal that has been most commonly employed in piezo-electric experiments, in the past, has been quartz. As a rule, investigators have used thin, flat plates or rods 1 of quartz rectangular in cross section, and coated on their opposite faces with tinfoil coatings 2, Fig. 1.

As is explained in my application Serial No. 20,277, filed April 2, 1925, for reissue of my Letters Patent No. 1,450,246, of which the present application is a division, such a plate or rod 1, Fig. 1, the conducting coatings 2 of which are connected with a source of high-frequency current 4 by conductors 3, as shown in Fig. 1, becomes set into vibration at various frequencies of the alternating current. The amplitude of such forced vibrations is exceedingly minute, except when the frequency of the current approximates a natural frequency of mechanical vibration of the plate. Even at this natural frequency, the changes in the dimensions of the plate resulting from its forced vibrations are so minute as to escape detection under ordinary conditions. They are nevertheless sufficient to exert a marked reaction upon the electric current.

When the plate is made from a piezo-electric crystal of good elastic qualities, such as quartz, when its width is small in comparison with its length, and it is mounted in such manner that its vibrations will be damped as little as possible, the reaction is extremely sharp and very pronounced. Such a plate, connected to a source of electric oscillations of variable frequency, will respond when one and only one frequency—neglecting for the moment overtone—is being generated. It forms a piezo-electric resonator, somewhat analogous to the acoustical resonators of Helmholtz.

It is not necessary that the device comprise a long, narrow plate, although this has its advantages in permitting greater sharpness of tuning, and in securing greater freedom from effects that might be produced by undesired modes of vibration. For a coupling device between two circuits, it is advantageous to employ a relatively wide plate, since larger amounts of energy can then be transmitted. The plate may have various shapes, or some other form than a plate may be used, including the entire native crystal itself. In fact, it is within the scope of the present invention to use other electro-mechanical vibrators than piezo-electric crystals. The only essential condition is that the vibrator shall be mounted and connected to an oscillating circuit of variable frequency in such a manner as to react electrically upon such circuit at a particular frequency. In general, the more complicated the form the more numerous are the frequencies to which the unit will respond.

According to the invention illustrated in Fig. 2, this piezo-electric resonator is used to couple mechanically one high-frequency circuit to another in order to transmit energy from one to the other circuit at a certain particular frequency. In this figure, 1 is the piezo-electric resonator, having two pairs of coatings 7 and 8, one pair 7 of which is connected to the oscillating circuit 3, which contains also a coil 9 and a condenser 10, while the other pair of coatings 8 is connected to a similar oscillating circuit 11 containing a coil 12 and a condenser 13. The figure is intended merely to illustrate the general principles which apply to any of the numerous types of high-frequency circuit.

In this case, the following action takes place: Assuming that 3 represents the primary circuit, then, whenever an alternating current, at the critical frequency, flows in that circuit, the plate 1 will be brought into energetic vibration through the agency of the alternating potential differences between the coatings 7. These vibrations, will, in turn, generate potential differences in the coatings 8, which will cause an alternating current of the same frequency to flow in the secondary circuit 11. At other frequencies, the forced vibrations in the resonator 1 will be of very small amplitude, hence the induced current will be correspondingly small. The current flowing in the coil 12, at the frequency of the crystal, may be detected in any desired way, or it may be otherwise utilized.

While the fundamental frequency of the plate or rod will usually give the strongest reaction, the various overtone vibrations can also be employed, giving reactions at frequencies approximately two, three or more times the fundamental. Or, if the plate has other dimensions comparable with its length, or if some other shape than that of a plate is used, some other mode of vibration, giving a still different frequency, may be utilized. When the vibrating unit has once been suitably prepared and mounted, its resonant frequencies are, to a high degree of precision, fixed for all time.

It will be understood that the invention is not restricted to the exact embodiments thereof that are illustrated and described herein, as other modifications will readily occur to persons skilled in the art, and all such are considered to fall within the spirit and scope of the invention, as defined in the appended claims.

What I claim as my invention is:

1. A piezo-electric resonator consisting of a plate or rod of piezo-electric crystal, a plurality of pairs of conductive coatings applied to the regions of opposite electrification thereon, and means for connecting such pairs of coatings to a corresponding number of alternating-current circuits, as herein described.

2. An alternating-current system comprising two resonant circuits, a piezo-electric body connected with one of the circuits, and means for transmitting energy from the said one circuit to the other circuit through the resonant vibrations of the body.

3. An alternating-current system comprising two resonant circuits, and means comprising a piezo-electric body connected with one of the circuits and so designed as to react electrically upon the other circuit.

4. An alternating-current system comprising two resonant circuits, and means comprising a piezo-electric body designed to transfer energy from one of the circuits to the other circuit.

5. An alternating-current system comprising two circuits, and an electro-mechanical vibrator for coupling the circuits together and having two pairs of coatings, the vibrator being adapted to vibrate mechanically when stimulated electrically and to respond electrically when vibrated mechanically, one of the pairs of coatings being connected with one of the circuits and the other pair of coatings being connected with the other circuit.

6. A piezo-electric body having a plurality of pairs of conducting coatings, the elements of each pair being adjacent to regions thereof that exhibit opposite electrification when the body vibrates.

In testimony whereof, I hereunto affix my signature.

WALTER G. CADY.